(12) United States Patent
Ohta (10) Patent No.: US 7,016,387 B2
(45) Date of Patent: Mar. 21, 2006

(54) SEMICONDUCTOR LASER ELEMENT PRODUCED BY ALIGNING A PHOTOMASK TO PATTERN AN ELECTRODE PORTION SUPERPOSED ON INNER PORTIONS OF UPPER SURFACES OF WINDOW REGIONS AT OPPOSITE END FACES

(75) Inventor: Masayuki Ohta, Yamtokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 88 days.

(21) Appl. No.: 10/302,392

(22) Filed: Nov. 22, 2002

(65) Prior Publication Data

US 2003/0118918 A1 Jun. 26, 2003

(30) Foreign Application Priority Data

Dec. 21, 2001 (JP) ............................. 2001-388603

(51) Int. Cl.
*H01S 5/042* (2006.01)
*H01S 5/10* (2006.01)
*H03F 1/00* (2006.01)
*H03F 9/00* (2006.01)
*H03F 7/20* (2006.01)

(52) U.S. Cl. .............................. 372/49.01; 372/43.01; 372/87; 372/98; 430/5; 430/22; 430/319; 430/321

(58) Field of Classification Search .................. 372/49, 372/103, 43, 49.01, 87, 88; 430/5, 22, 311, 430/319–321

See application file for complete search history.

(56) References Cited

U.S. PATENT DOCUMENTS

| 4,337,443 A | * | 6/1982 | Umeda et al. ................. 372/49 |
| 5,228,047 A | * | 7/1993 | Matsumoto et al. ........... 372/45 |
| 5,593,815 A | * | 1/1997 | Ahn ............................. 430/321 |
| 5,799,028 A | * | 8/1998 | Geels et al. ................... 372/49 |
| 5,802,091 A | * | 9/1998 | Chakrabarti et al. ........... 372/49 |
| 5,815,522 A | * | 9/1998 | Nagai ..................... 372/46.016 |

FOREIGN PATENT DOCUMENTS

| JP | 06-275485 | 9/1994 |
| JP | 10-070064 | 3/1998 |

* cited by examiner

Primary Examiner—Mark F. Huff
Assistant Examiner—John Ruggles
(74) Attorney, Agent, or Firm—Morrison & Foerster LLP (57) ABSTRACT

A semiconductor laser element that has window regions at its opposite end faces and an electrode portion superposed on an inner portion of the upper surface thereof to include covering an inner portion of the upper surfaces of the window regions without covering the entire upper surfaces of the window regions, by aligning a photomask for forming electrode pattern segments at a predetermined position over a laser substrate, which includes a plurality of element regions in a matrix pattern and a plurality of window region pattern stripes corresponding to the window regions of the element regions, the electrode pattern segments being used for forming electrodes at predetermined positions between the adjacent window region pattern stripes, wherein the photomask includes: an electrode pattern region for forming the electrode pattern segments; and an auxiliary mask having a scale section for measuring the amount of alignment deviation of the electrode pattern segments with respect to the window region pattern.

2 Claims, 7 Drawing Sheets

SEMICONDUCTOR LASER ELEMENT PRODUCED BY ALIGNING A PHOTOMASK TO PATTERN AN ELECTRODE PORTION SUPERPOSED ON INNER PORTIONS OF UPPER SURFACES OF WINDOW REGIONS AT OPPOSITE END FACES

BACKGROUND OF THE INVENTION

1. Field of the Invention

The present invention relates to a photomask used for forming an electrode portion in a high-power semiconductor laser element used in an optical reading/recording drive for CD, CD-R/RW (Recordable/Rewritable), etc., especially in a window-structure semiconductor laser element having a window region. Further, the present invention relates to a method for producing a semiconductor laser element using such a photomask. Furthermore, the present invention relates to a semiconductor laser element produced using such a photomask.

2. Description of the Related Art

Figure 9:
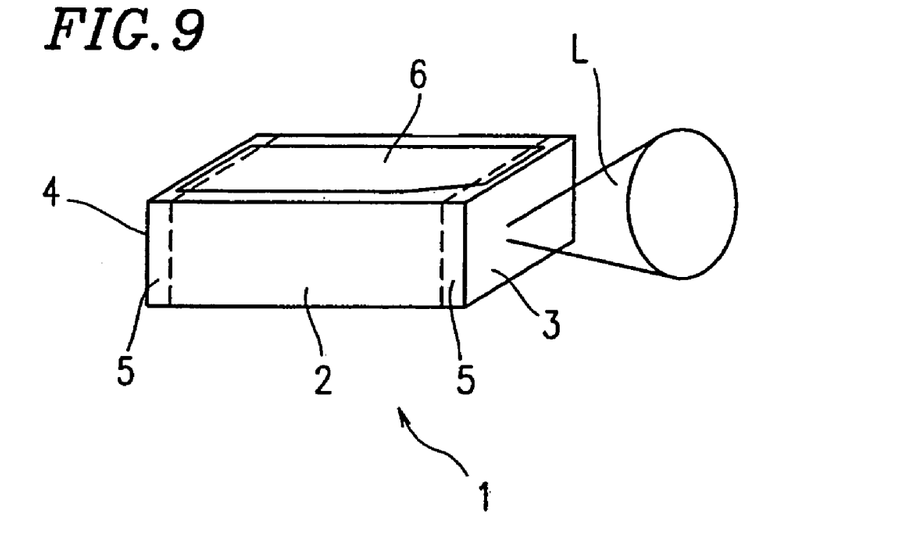
FIG. 9 is a perspective view showing a semiconductor laser element having a window region.

FIG. 9 is a perspective view showing a semiconductor laser element 1 having a window region.

The semiconductor laser element 1 includes a small rectangular laser element main body 2 which is obtained by separating a substrate (wafer) including a laser element structure. One of the side surfaces of the laser element main body 2 has a low reflectance so as to act as a laser light emitting face 3 from which laser light L is emitted. Another face of the laser element main body 2 which is opposite to the laser light emitting face 3 has a high reflectance so as to act as a laser light reflecting face 4. Each of the laser light emitting face 3 and the laser light reflecting face 4 is provided with a thin window region 5 for efficiently transmitting the laser light L.

On the upper surface of the laser element main body 2, an electrode portion 6 is formed such that a portion of the electrode portion 6 is superposed on the laser element to include covering an inner portion of the upper surfaces of the window regions 5 (without covering the entire upper surfaces of the window regions 5). formed on the laser light emitting face 3 and the laser light reflecting face 4.

In the semiconductor laser element 1 having such a structure, due to the window regions 5 formed on the laser light emitting face 3 and the laser light reflecting face 4, absorption by the faces 3 and 4 of laser light generated in an active layer inside the chip-shaped laser element main body 2 is reduced, and as a result, damages caused in the faces 3 and 4 can be prevented.

The chip-shaped semiconductor laser element 1 having the window regions 5 is produced by: forming a large number of element regions, which will be semiconductor laser elements 1, on a single substrate in a predetermined pattern; forming electrode portions corresponding to the respective element regions over the substrate; and separating the substrate into pieces of the respective element regions.

Figure 10:
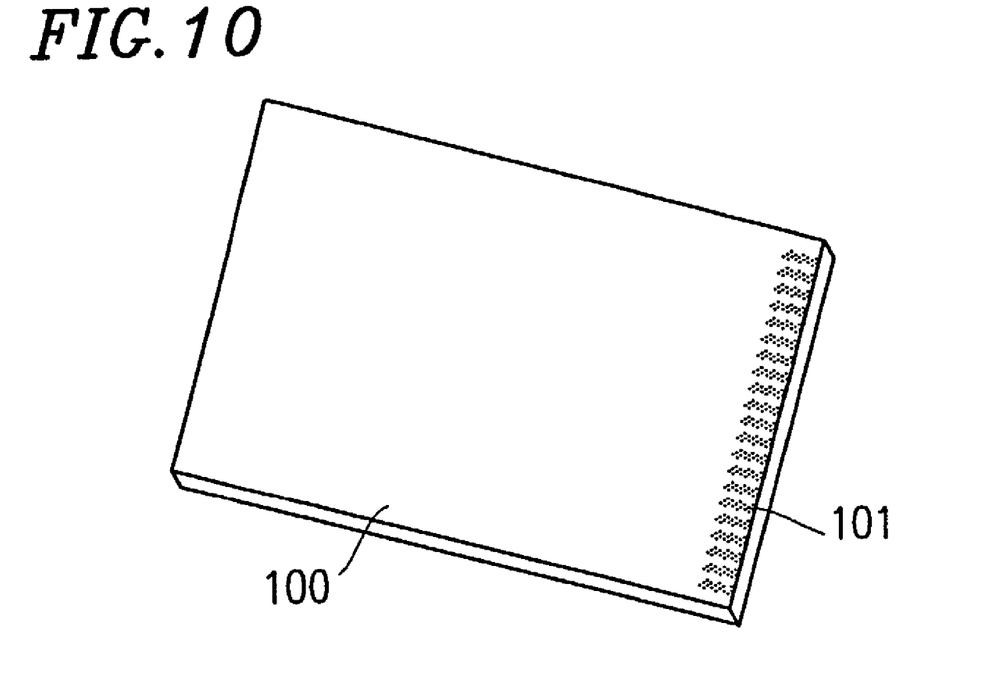
FIG. 10 shows a laser substrate, on which a metal layer for an electrode and a resist for patterning the metal layer will be applied.

FIG. 10 shows a substrate 100 for laser elements (hereinafter, referred to as "laser substrate 100") on which, after an element structure is formed at a predetermined position, a metal film which will work as an electrode is formed in a predetermined pattern for each element region over the element structure, and a resist is applied over the metal film.

Over the laser substrate 100, a plurality of element regions, each of which will be a semiconductor laser element having window regions, are formed in a predetermined matrix pattern. A window region pattern 101, which will be window regions, is formed by a plurality of stripes extending along the longitudinal direction of the laser substrate 100 with predetermined intervals therebetween along the width direction of the laser substrate 100. After the window region pattern 101 has been formed over the laser substrate 100, a metal film which will function as an electrode, and a resist for patterning the metal film, are formed such that each layer has a predetermined thickness. A portion of the structure on the laser substrate 100, on which the metal film and resist are formed, cannot be observed from outside due to the metal film and resist. However, as shown in FIG. 10, a window region 101 is exposed at one side of the laser substrate 100 so that the position of the window region 101 can be observed through an infrared microscope.

On the upper surface of the resultant structure over the laser substrate 100, a photomask having a predetermined electrode pattern for forming electrode portions corresponding to the respective element regions is provided. This photomask is provided while the window region 101 exposed at the one side of the laser substrate 100 and the photomask are aligned with respect to each other by sight through an infrared microscope.

After the photomask has been aligned so as to be placed at an appropriate position where the window region 101 is provided, an exposure step and development step are performed to pattern the resist such that only a portion of the photomask over which the electrode pattern is formed is left unetched, and then, the photomask is removed. Then, the resist on which the electrode pattern has been formed is used as a mask to perform etching on the metal film, whereby an electrode portion 6 having a desired pattern is formed. Thereafter, the resist is removed.

Figure 11:
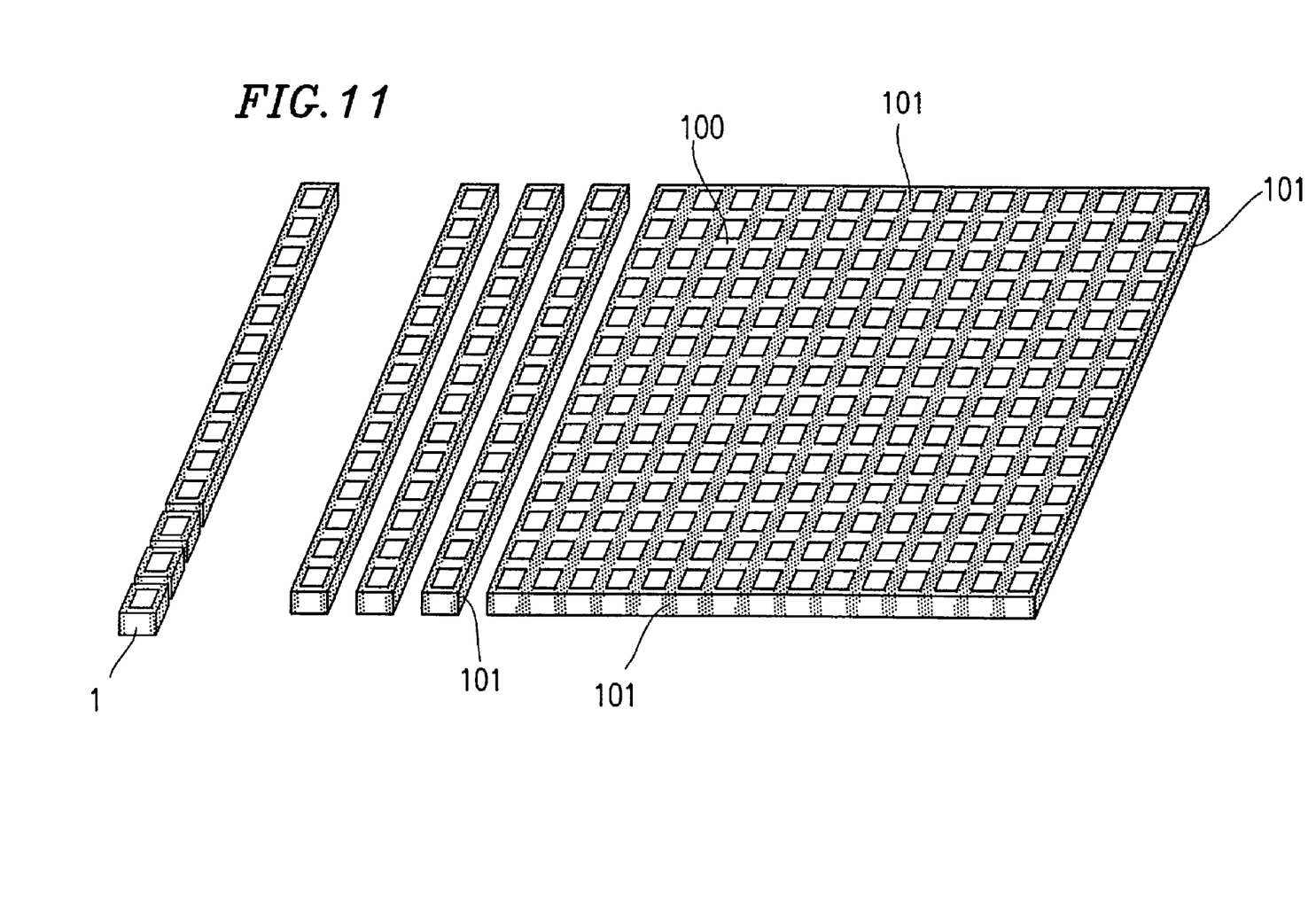
FIG. 11 is a perspective view illustrating a production process of semiconductor laser elements (separation of a laser substrate).

After the formation of the electrode portion 6, the laser substrate 100 is separated into respective chip-shaped laser elements 1. As shown in FIG. 11, the laser substrate 100 is first separated along the stripe-shaped window region 101 into a plurality of bars, and each bar is further separated along a direction perpendicular to the window region 101, into predetermined, rectangular chip-shaped semiconductor laser elements 1.

In the window region 5 of the semiconductor laser element 1, a gain cannot be obtained with respect to laser light emission. Thus, if the window region 5 is large, an effective resonator length becomes short, and as a result, the I-L characteristic (current-optical output characteristic) of the laser light L emitted from the semiconductor laser element 1 decreases. On the other hand, the window region 5 does not function as a window region unless the window region 5 has a thickness of about 15 $\mu$m or more from the faces 3 and 4 of the semiconductor laser element 1. Thus, the window region 5 of the semiconductor laser element 1 typically has a thickness of about 20 to 30 $\mu$m or more from the faces 3 and 4 of the semiconductor laser element 1.

On the other hand, each stripe of the window region pattern 101 formed on the laser substrate 100 has a width of about 40 to 60 $\mu$m. The electrode pattern (electrode pattern segments) is formed at an interval of 20 to 30 $\mu$m.

According to a conventional method, at a step of aligning a photomask for forming electrode portions 6 over the window region pattern 101 on the laser substrate 100, alignment is performed by observation through an infrared microscope, such that the center line of each stripe of the window region pattern 101 with respect to (i.e., "perpendicular to") its width direction is aligned with the center line of an area between adjoining rows of electrode pattern segments, which is also a separation line along which the laser substrate 100 is separated into bars at a separation step performed later. In this conventional method, an error (deviation) of alignment is not quantitatively evaluated. As a result, it is difficult to align a photomask with respect to the window region pattern 101 of the laser substrate 100 with a sufficient alignment accuracy.

SUMMARY OF THE INVENTION

According to one aspect of the present invention, there is provided a photomask used in a process of producing a semiconductor laser element which has window regions at its opposite end faces and an electrode on an upper surface thereof between the window regions, the photomask being used for forming electrode pattern segments at a predetermined position over a laser substrate which includes a plurality of element regions, which will be element bodies of the semiconductor laser element, in a matrix pattern and a plurality of window region pattern stripes corresponding to the window regions of the element regions, the electrode pattern segments being used for forming electrodes at predetermined positions between the adjacent window region pattern stripes, wherein the photomask includes: an electrode pattern region for forming the electrode pattern segments; and an auxiliary mask having a scale section for measuring the amount of alignment deviation of the electrode pattern segments with respect to the window region pattern, the scale section being positioned so as to obliquely overlap the window region pattern stripes.

According to another aspect of the present invention, there is provided a photomask used in a process of producing a semiconductor laser element which has window regions at its opposite end faces and an electrode on an upper surface thereof between the window regions, the photomask being used for forming electrode pattern segments at a predetermined position over a laser substrate which includes a plurality of element regions, which will be element bodies of the semiconductor laser element, in a matrix pattern and a striped window region pattern at a predetermined position with respect to the element regions, wherein the photomask includes: an electrode pattern region for forming the electrode pattern segments; and an auxiliary mask formed adjacent to the electrode pattern region for measuring the amount of alignment deviation of the electrode pattern segments with respect to the window region pattern.

In one embodiment of the present invention, the auxiliary mask has a measurement pattern slanted with respect to a longitudinal center line between adjoining rows of electrode pattern segments of the electrode pattern region which is perpendicular to the width direction of the electrode pattern region, the longitudinal center line extending in a direction along which the laser substrate is to be separated into the semiconductor laser elements after the electrode pattern segments are formed on the laser substrate.

In another embodiment of the present invention, the auxiliary mask has a measurement pattern slanted with respect to a longitudinal center line of the window region pattern which is perpendicular to the width direction of the window region pattern, the longitudinal center line extending in a direction along which the laser substrate is to be separated into the semiconductor laser elements after the electrode pattern segments are formed on the laser substrate.

In still another embodiment of the present invention, the measurement pattern includes a plurality of protrusions at a predetermined interval, the protrusions functioning as a scale for counting the amount of alignment deviation of the electrode pattern segments.

In still another embodiment of the present invention, the measurement pattern is slanted at an inclination angle of about 10° to 20° with respect to the longitudinal center line between the adjoining rows of the electrode pattern segments of the electrode pattern region; and the width of each protrusion of the measurement pattern and the interval of the protrusions of the measurement pattern are 2–4 μm.

In still another embodiment of the present invention, the measurement pattern is slanted at an inclination angle of about 10° to 20° with respect to the longitudinal center line of the window region pattern; and the width of each protrusion of the measurement pattern and the interval of the protrusions of the measurement pattern are 2–4 μm.

In still another embodiment of the present invention, the auxiliary mask has the shape of a right-angled triangle formed based on a side extending along the longitudinal center line between the adjoining rows of the electrode pattern segments of the electrode pattern region and another side which is perpendicular to the longitudinal center line; and the measurement pattern is formed in the hypotenuse of the right-angled triangle.

In still another embodiment of the present invention, the auxiliary mask has the shape of a right-angled triangle formed based on a side extending along the longitudinal center line of the window region pattern and another side which is perpendicular to the longitudinal center line: and the measurement pattern is formed in the hypotenuse of the right-angled triangle.

In still another embodiment of the present invention, the measurement pattern has a reference portion for measuring the amount of alignment deviation of the electrode pattern segments, the reference portion being placed on the longitudinal center line between adjoining rows of electrode pattern segments of the electrode pattern region at a central portion of the electrode pattern region with respect to its width direction.

In still another embodiment of the present invention, the measurement pattern has a reference portion for measuring the amount of alignment deviation of the electrode pattern segments, the reference portion being placed on the longitudinal center line of the window region pattern with respect to its width direction.

In still another embodiment of the present invention, the reference portion is a center mark formed of a through-hole, or a notch having a shape different from that of the protrusion.

In still another embodiment of the present invention, each electrode pattern segment has the shape of a parallelogram, the parallelogram being formed based on a pair of slanted sides which are slanted with respect to the longitudinal center line of the electrode pattern region and a pair of vertical sides perpendicular to the longitudinal center line of the electrode pattern region; and the auxiliary mask is placed adjacent to a pair of electrode pattern segments formed so as to sandwich the longitudinal center line of the electrode pattern region, the auxiliary mask including a pair of parallelograms having the same shape as that of the adjacent electrode pattern segment, each parallelogram having the measurement pattern in its slanted side near the longitudinal center line of the electrode pattern region.

In still another embodiment of the present invention, each electrode pattern segment has the shape of a parallelogram, the parallelogram being formed based on a pair of slanted sides which are slanted with respect to the longitudinal center line of the window region pattern and a pair of vertical sides perpendicular to the longitudinal center line of the window region pattern; and the auxiliary mask is placed adjacent to a pair of electrode pattern segments formed so as to sandwich the longitudinal center line of the window region pattern, the auxiliary mask including a pair of parallelograms having the same shape as that of the adjacent electrode pattern segment, each parallelogram having the measurement pattern in its slanted side near the longitudinal center line of the window region pattern.

According to still another aspect of the present invention, there is provided a method for producing a semiconductor laser element, comprising steps of: placing the above-described photomask of the present invention over a laser substrate which includes a plurality of element regions, which will be element bodies of the semiconductor laser element, in a matrix pattern and a plurality of window region pattern stripes corresponding to window regions of the element regions; and counting the number of protrusions which overlap the window region of the laser substrate and which are placed higher than the reference portion of the measurement pattern of the auxiliary mask and the number of protrusions which overlap the window region of the laser substrate and which are placed lower than the reference portion of the measurement pattern of the auxiliary mask, and adjusting the position of the photomask such that the number of the overlapping protrusions which are placed higher than the reference portion is equal to the number of the overlapping protrusions which are placed lower than the reference portion, whereby the photomask is placed at an appropriate position on the laser substrate.

According to still another aspect of the present invention, a method for producing a semiconductor laser element, comprising steps of: placing the above photomask of the present invention over a laser substrate which includes a plurality of element regions, which will be element bodies of the semiconductor laser element, in a matrix pattern and a plurality of window region pattern stripes corresponding to window regions of the element regions; and counting the number of protrusions of the measurement pattern of the auxiliary mask formed by a pair of parallelograms which overlap the window region of the laser substrate, and adjusting the position of the photomask such that the number of the overlapping protrusions of one of the parallelograms is equal to the number of the overlapping protrusions of the other parallelogram, whereby the photomask is placed at an appropriate position on the laser substrate.

According to still another aspect of the present invention, there is provided a semiconductor laser element produced by the method for producing the above semiconductor laser element of the present invention, wherein: in a process of forming electrode portions, the measurement pattern of the auxiliary mask is used to align stripes of window regions formed on the laser substrate and electrode pattern segments formed on the photomask so as not to cause alignment deviation; and the thickness of the window regions at end faces of the semiconductor laser elements obtained after separation of the laser substrate is equal among the semiconductor laser elements.

Thus, the invention described herein makes possible the advantages of providing: (1) a photomask for forming an electrode pattern at an accurate position with respect to a window region pattern on a laser substrate; (2) a method for producing a semiconductor laser element using such a photomask; and (3) a semiconductor laser element produced using such a semiconductor laser element production method.

These and other advantages of the present invention will become apparent to those skilled in the art upon reading and understanding the following detailed description with reference to the accompanying figures.

DESCRIPTION OF THE PREFERRED EMBODIMENTS

Hereinafter, a photomask of the present invention, a semiconductor laser element produced by performing alignment using such a photomask, and a method for producing a semiconductor laser element using such a photomask, are described with reference to the drawings.

(Embodiment 1)

Figure 1:
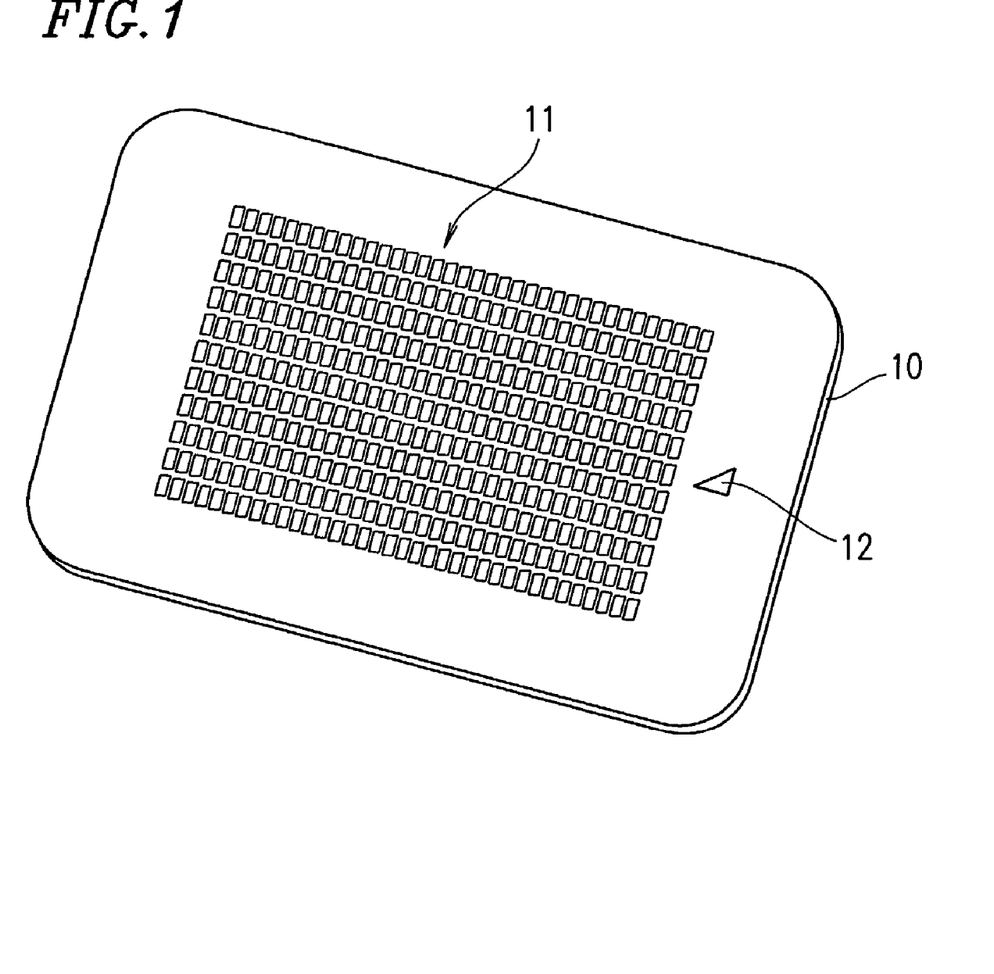
FIG. 1 shows a photomask according to embodiment 1 of the present invention.

FIG. 1 shows a photomask 10 according to embodiment 1 of the present invention.

The photomask 10 includes an electrode pattern region 11 in the central region thereof. The electrode pattern region 11 includes a plurality of electrode pattern segments arranged in a matrix such that the electrode pattern segments correspond to respective laser element regions formed on the laser substrate 100 (see FIG. 10). At one side of the electrode pattern region 11, a triangular auxiliary mask 12 is provided. The auxiliary mask 12 has a scale section, which is used for aligning a virtual center line of the striped window region pattern (see the pattern 101 of FIG. 11), which is formed on the longitudinal central line of the laser substrate 100, with a center line of the electrode pattern region 11 perpendicular to its width direction (i.e., the longitudinal center line of the electrode pattern 11), such that the electrode pattern segments are aligned with the respective laser element regions formed on the laser substrate 100.

Figure 2:
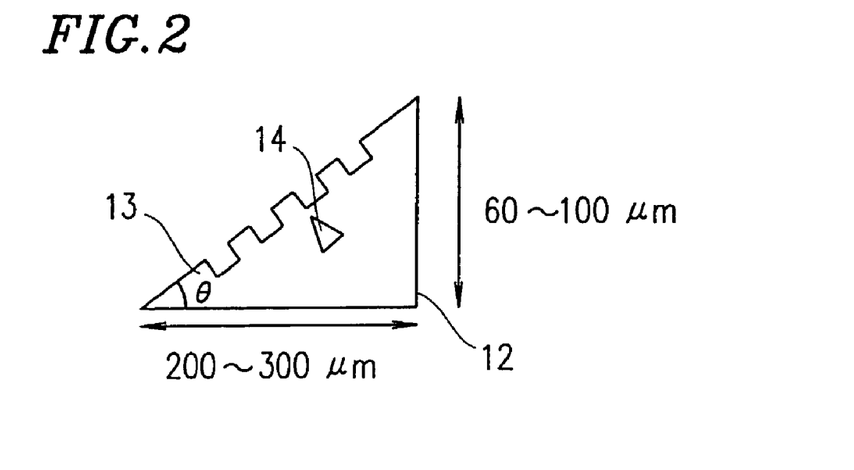
FIG. 2 is a plan view showing an auxiliary mask formed on the photomask of embodiment 1.

FIG. 2 is a plan view enlargedly showing the auxiliary mask 12 formed adjacent to the electrode pattern region 11. The auxiliary mask 12 has the shape of a right-angled triangle formed based on a side collinear with the center line between adjoining rows of electrode pattern segments at a central portion of the electrode pattern region 11 with respect to its width direction (i.e., the longitudinal central portion), and another side which is perpendicular to the center line. For example, a first side of the triangle extending along the center line between the rows of electrode pattern segments has a length of 200–300 $\mu$m, and a second side which is perpendicular to the first side has a length of 60–100 µm. The triangular auxiliary mask 12 has a measurement pattern (scale section) 13 including small protrusions (teeth) formed with predetermined intervals along its hypotenuse (third side). The measurement pattern 13 is used for measuring (counting) the amount of an alignment deviation of the center line of the photomask 10 which is perpendicular to its width direction (i.e., the longitudinal center line of the photomask 10) from the center line of the laser substrate 100 perpendicular to its width direction (i.e., the longitudinal center line of the laser substrate 100), by observing through an infrared microscope. The width of each protrusion and the interval of the protrusions are, for example, 2–4 µm and 3 µm, respectively, which are determined due to the limit on the process accuracy for shaping a photomask.

Figure 3:
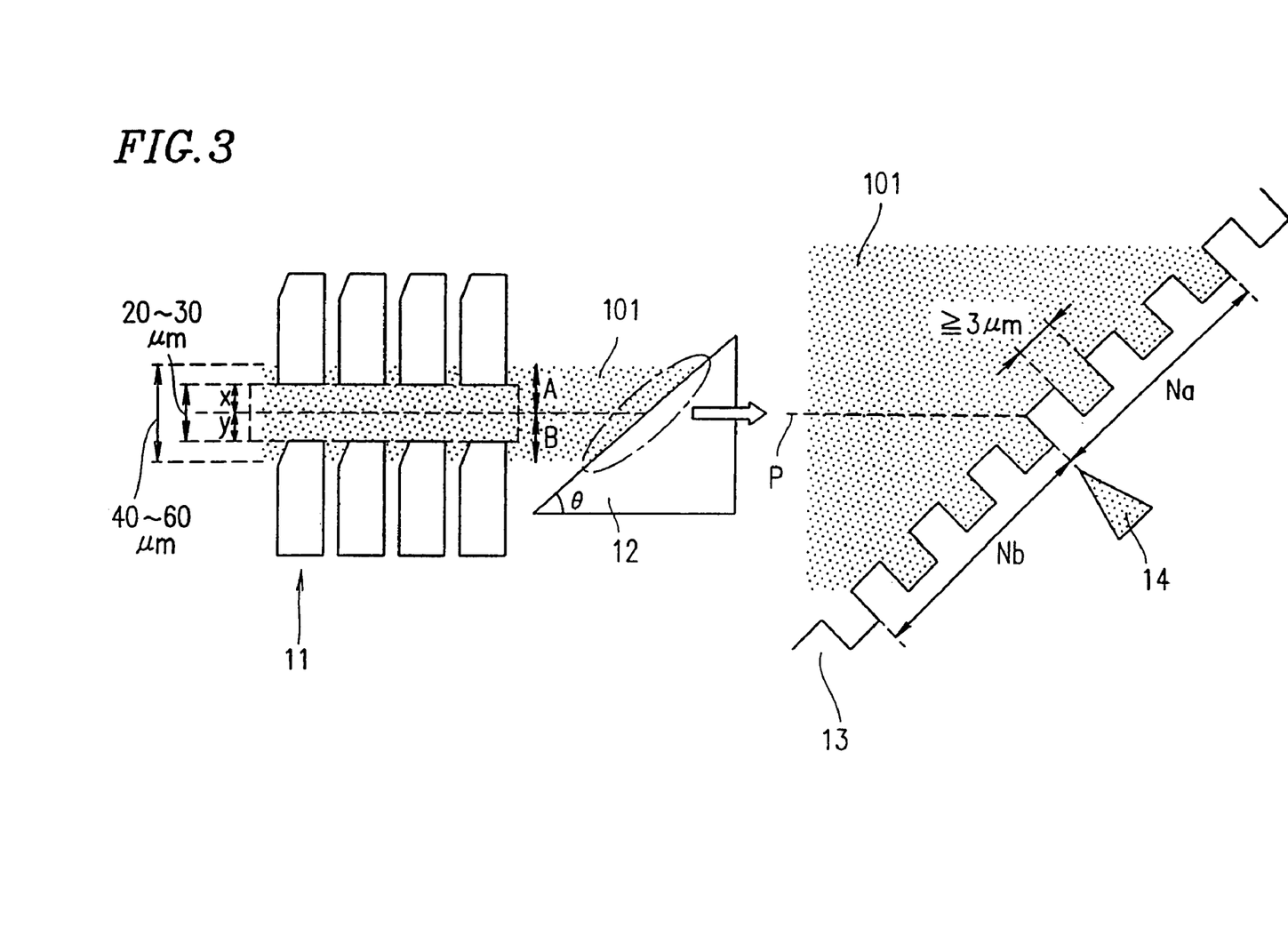
FIG. 3 is a plan view illustrating placement of an electrode pattern of the photomask over a laser substrate.

Further, a center mark 14 is formed at about a central portion of the measurement pattern 13. The center mark 14 is used as a reference for aligning the photomask 10 and the laser substrate 100 with each other. For example, the center mark 14 is a triangular through-hole, for example, an isosceles triangle as shown in FIG. 2. The center mark 14 is formed such that the vertex of the isosceles triangle points to an intersection of the center line P of the photomask 10 with the measurement pattern 13, as shown in FIG. 3.

The measurement pattern 13 formed in the auxiliary mask 12 is inclined at an inclination angle $\theta$ with respect to the longitudinal center line between adjoining rows of electrode pattern segments of the electrode pattern region 11. If the measurement pattern 13 is formed so as to be perpendicular to the center line of the electrode pattern region 11, a reduction in deviation of alignment is limited by the process accuracy for shaping a photomask. For example, in the case where the protrusions of the measurement pattern 13 are formed at an interval of 3 µm, the measurement accuracy of 3 µm or smaller cannot be achieved. However, in this embodiment, the measurement pattern 13 is inclined at an inclination angle $\theta$ with respect to the center line of the electrode pattern region 11, and therefore, an alignment deviation A of the photomask 10 can be enlarged using the auxiliary mask 12 by $A/\sin \theta$ for measurement. For example, when a side of the auxiliary mask 12 which extends along the center line between the adjoining rows of electrode pattern segments has a length of 200 µm, another side of the auxiliary mask 12 which is perpendicular to the center line between the adjoining rows has a length of 60 µm, and the inclination angle $\theta$ of the measurement pattern 13 satisfies $\sin \theta = 60/\sqrt{(200^2+60^2)}$, the measurement accuracy for measuring an alignment deviation can be improved up to 3 (µm)×$\sin \theta$=0.86 (µm).

Theoretically, the alignment accuracy increases as the inclination angle $\theta$ of the measurement pattern 13 decreases. However, as the inclination angle $\theta$ is decreased, the dimension (side) of the triangular auxiliary mask 12 along the longitudinal center line of the electrode pattern region 11 is increased. As a result, an effective area obtained over a single laser substrate 100 is decreased, and accordingly, the number of laser element chips produced from a single laser substrate 100 is decreased. Further, the alignment of the photomask 10 is detected using infrared transmitted light having a wavelength of about 800 nm, and therefore, it is impossible in principle to achieve an alignment accuracy higher than such a wavelength.

Thus, it is preferable that the inclination angle $\theta$ of the measurement pattern 13 is set to about 10° to 20°, so that a measurement accuracy of about 0.8 µm can be achieved. For example, as described above, the inclination angle $\theta$ is set such that $\theta = \sin^{-1}(60/\sqrt{(200^2+60^2)})$, whereby the measurement accuracy of 0.86 µm can be obtained.

A method for placing the photomask 10 having the auxiliary mask 12 on the laser substrate 100 while aligning the photomask 10 with the laser substrate 100 is now described.

FIG. 3 is a plan view illustrating placement of the electrode pattern region 11 of the photomask 10 over the laser substrate 100 (where the photomask 10 and substrate 100 are not shown for reasons of clarity).

In the first place, the photomask 10 is placed over the laser substrate 100 while observing through an infrared microscope such that the rows of electrode pattern segments are positioned between the stripes of the window region pattern formed on the laser substrate 100.

Thereafter, alignment is performed using the scale section of the auxiliary mask 12 formed in the photomask 10, such that the longitudinal center line of the laser substrate 100 is aligned with the longitudinal center line of the photomask 10 with high accuracy, i.e., such that no alignment deviation (error) is caused between the center lines. In this case, specifically, alignment is performed using the scale section of the auxiliary mask 12, such that the longitudinal center lines of the stripes of the window region pattern formed on the laser substrate 100 and the center lines between the adjoining rows of electrode pattern segments are aligned with each other with high accuracy, i.e., such that no alignment deviation is caused between the center lines.

The toothed measurement pattern 13 of the auxiliary mask 12 has the center mark 14 corresponding to the center line of the electrode pattern region 11. The center mark 14 is used as a reference to count the number of protrusions of the measurement pattern 13 that obliquely overlap a stripe of the window region pattern 101. Specifically, the number of overlapping protrusions higher than the reference center mark 14, Na, and the number of overlapping protrusions lower than the reference center mark 14, Nb, are counted. The position of the photomask 10 is adjusted such that the counted number Na is equal to the counted number Nb (Na=Nb), whereby the electrode pattern region 11 of the photomask 10 is placed at an appropriate position over the laser substrate 100. In the example illustrated in FIG. 3, the number Na of protrusions which overlap a stripe (window region) of the window region pattern 101 are higher than the reference centermark 14 is 3 (Na=3), and the number Nb of protrusions which overlap a stripe (window region) of the window region pattern 101 and are lower than the reference center mark 14 is also 3 (Nb=3). This means that the electrode pattern segments of the photomask 10 are placed over the laser substrate 100 without alignment deviation for a measurement accuracy of about 0.86 µm (x=y, A=B). In this way, the virtual center lines of the stripes of the window region pattern 101 on the laser substrate 100 and the center lines between the adjoining rows of electrode pattern segments are adjusted so as to be aligned with each other, whereby alignment of the photomask 10 with respect to the laser substrate 100 can be performed with high accuracy. As a result, an electrode pattern can be formed accurately at an appropriate position with respect to the window region pattern 101 on the laser substrate 100.

A broken line P of FIG. 3 represents the center line between the adjoining rows of electrode pattern segments at a longitudinal central portion of the photomask 10. The broken line P is a virtual line drawn in FIG. 3 for convenience of explaining the above-described alignment method, but is not actually drawn on the photomask 10.

Figure 4:
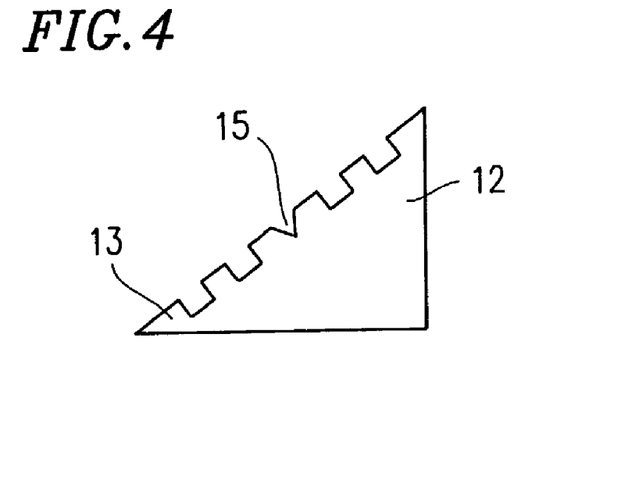
FIG. 4 is a plan view showing another auxiliary mask formed on the photomask of embodiment 1.

FIG. 4 is a plan view showing another example of the auxiliary mask 12 formed on the photomask 10.

The auxiliary mask 12 of FIG. 4 has a center indentation 15 having the shape of a V-notch. The center indentation 15 is used as a reference for aligning the center lines of the stripes of the window region pattern 5 on the laser substrate 100 with the center lines between the adjoining rows of electrode pattern segments. The center indentation 15 is designed so as to be distinguishable from the other indentations of the measurement pattern 13 when viewed through an infrared microscope. Furthermore, in the auxiliary mask 12, any shape of mark different from the center mark 14 (FIG. 2) which is a triangular through-hole, or the V-shaped center indentation 15 (FIG. 4), can be employed as a reference for aligning the center lines so long as the mark can be identified when viewed through an infrared microscope.

(Embodiment 2)

Figure 5:
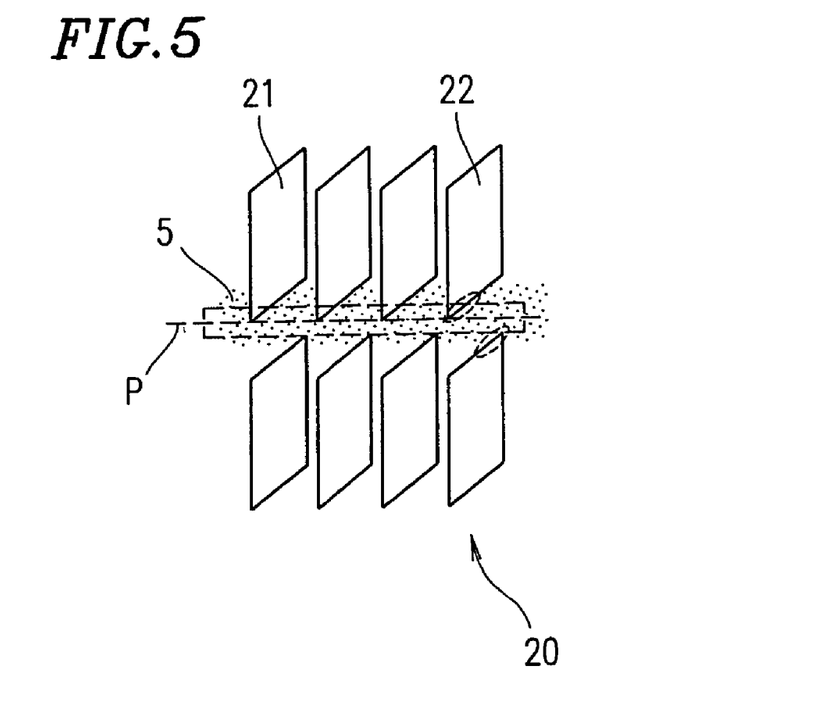
FIG. 5 shows a photomask according to embodiment 2 of the present invention.

FIG. 5 is a plan view showing a portion of a photomask 20 according to embodiment 2 of the present invention.

The photomask 20 includes an electrode pattern region (not shown) formed by a plurality of electrode pattern segments 21 which are arranged in a matrix such that the electrode pattern segments 21 correspond to respective laser element regions formed on the laser substrate 100. Each electrode pattern segment 21 formed on the photomask 20 of embodiment 2 has the shape of a parallelogram. The parallelogram is formed based on a pair of shorter sides which are slanted with respect to the direction of the stripes of the window region pattern 101 formed on the laser substrate 100, and a pair of longer sides perpendicular to the direction of the stripes of the window region pattern 101 (FIG. 10). The photomask 20 has the auxiliary masks 22, which are placed outside of the electrode pattern region formed by the electrode pattern segments 21, but adjacent to the electrode pattern segments 21. The auxiliary masks 22 are used for aligning the photomask 20 with the window region pattern 101 of the laser substrate 100.

Figure 6:
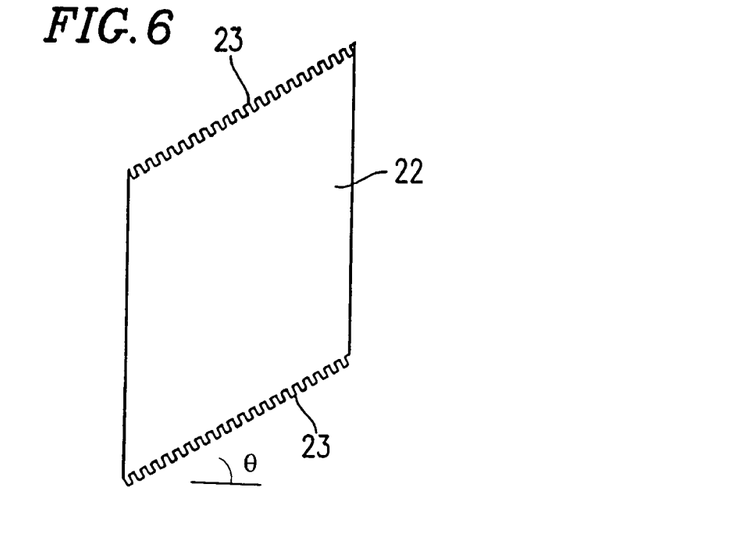
FIG. 6 is a plan view showing an auxiliary mask formed on the photomask of embodiment 2.

FIG. 6 is an enlarged view showing one of the auxiliary masks 22 formed on the photomask 20.

The auxiliary mask 22 has measurement patterns (scale sections) 23 on the shorter sides thereof. The measurement pattern 23 is used for alignment of the photomask 20 with the laser substrate 100. Specifically, the measurement pattern 23 is used for measuring the amount of an alignment deviation of the center line of the photomask 20 from the center line of the window region pattern of the laser substrate 100. The measurement pattern 23 has small protrusions (teeth) formed with predetermined intervals such that the number of the protrusions can be counted when viewed through an infrared microscope. As a result, the measurement pattern 23 alternately has protrusions and indentations. The width of each protrusion and the interval of the protrusions are, for example, 2–4 $\mu$m and 3 $\mu$m, respectively, which are determined due to the limit on the process accuracy for shaping a photomask.

The measurement pattern 23 formed in the auxiliary mask 22 is inclined, as described in embodiment 1, at an inclination angle $\theta$ with respect to the longitudinal center line between adjoining rows of electrode pattern segments 21 of the electrode pattern region. With such an inclination angle $\theta$, an alignment deviation can be measured with a measurement accuracy which is higher than the mask processing accuracy (A) by a factor of $1/\sin \theta$, i.e., with a measurement accuracy of $A \times 1/\sin \theta$. In this case also, alignment is performed using the inclined scale section of the auxiliary mask 22, such that the longitudinal center lines of the stripes of the window region pattern formed on the laser substrate 100 and the center lines between the adjoining rows of electrode pattern segments of the photomask 20 are aligned with each other with high accuracy, i.e., such that no alignment deviation is caused between the center lines.

Figure 7:
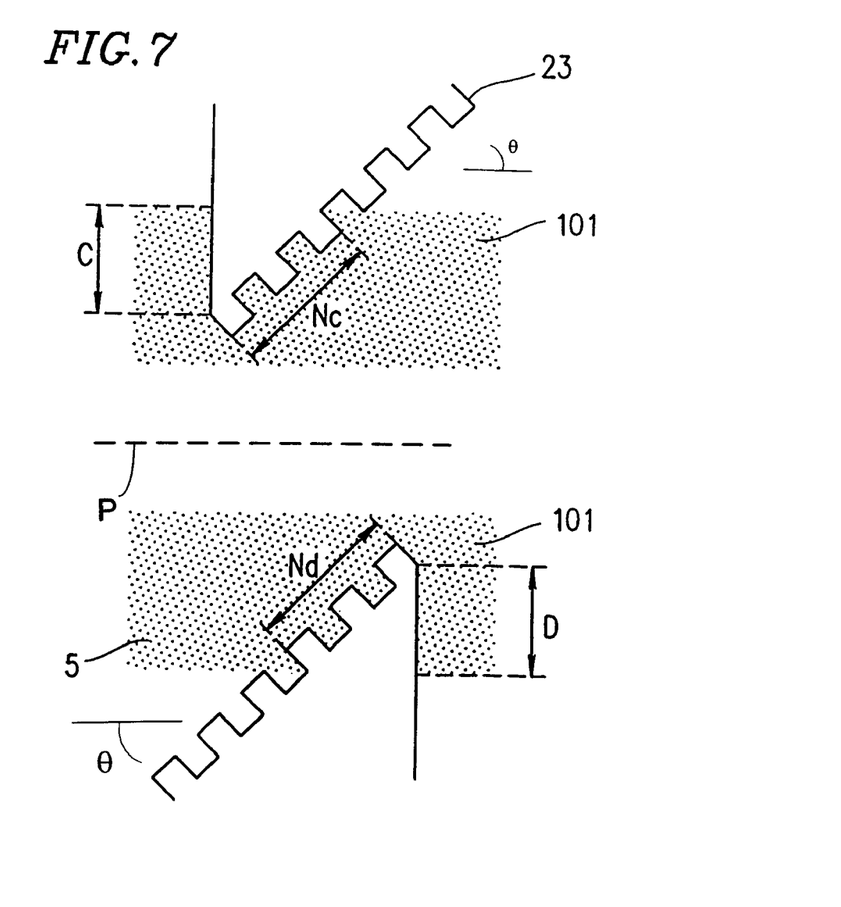
FIG. 7 is a plan view illustrating placement of an electrode pattern over a laser substrate.

Next, a method for placing the photomask 29 having the auxiliary mask 22 on the laser substrate 100 and aligning the photomask 20 such that the electrode pattern segments 21 of the photomask 20 are placed at appropriate positions over the laser substrate 100, is now described with reference to FIG. 7. FIG. 7 is a plan view enlargedly showing the measurement pattern 23 placed over the window region pattern 101 when the photomask 20 is placed on the laser substrate 100.

In order to place the photomask 20 at an appropriate position over the laser substrate 100, the photomask 20 is first placed over the laser substrate 100 while observing through an infrared microscope such that the electrode pattern segments 21 are positioned between the stripes of the window region pattern 101 formed on the laser substrate 100.

After the photomask 20 is placed over the laser substrate 100 such that the electrode pattern segments 21 are positioned generally between the stripes of the window region pattern 101 while observing, alignment is performed using the auxiliary mask 22 formed in the photomask 20, such that the longitudinal center lines of the stripes of the window region pattern 101 formed on the laser substrate 100 and the center lines between the adjoining rows of electrode pattern segments of the photomask 20 are aligned with each other with high accuracy, i.e., such that no alignment deviation is caused between the center lines.

When the photomask 20 is placed over the laser substrate 100 such that the electrode pattern segments 21 of the electrode pattern region are positioned between the stripes of the window region pattern 101 of the laser substrate 100, the measurement patterns 23 formed in the inclined sides of a pair of parallelogramic auxiliary masks 22 which are formed adjacent to the electrode pattern segments 21 obliquely overlap stripes of the window region pattern 101. Then, the number Nc of protrusions of the upper auxiliary mask 22 which overlap the window region 5, and the number Nd of protrusions of the lower auxiliary mask 22 which overlap the window region 5, are counted by viewing through an infrared microscope. The position of the photomask 20 is adjusted such that the counted number Nc is equal to the counted number Nd (Nc=Nd), whereby the photomask 20 is placed at an appropriate position over the laser substrate 100. In the example illustrated in FIG. 7, the number Nc of protrusions for the upper auxiliary mask 22 is 3 (Nc=3), and the number Nd of protrusions for the lower auxiliary mask 22 is also 3 (Nd=3). This means that the electrode pattern segments 21 of the photomask 20 are placed over the laser substrate 100 without alignment deviation for a measurement accuracy of about 0.86 $\mu$m. In this way, the virtual center lines of the stripes of the window region pattern 5 on the laser substrate 100 and the center lines between the adjoining rows of electrode pattern segments on the photomask 20 are accurately aligned with each other, whereby alignment of the photomask 20 with respect to the laser substrate 100 can be performed with high accuracy. As a result, an electrode pattern can be formed accurately at an appropriate position with respect to the window region pattern 5 on the laser substrate 100.

Figure 8:
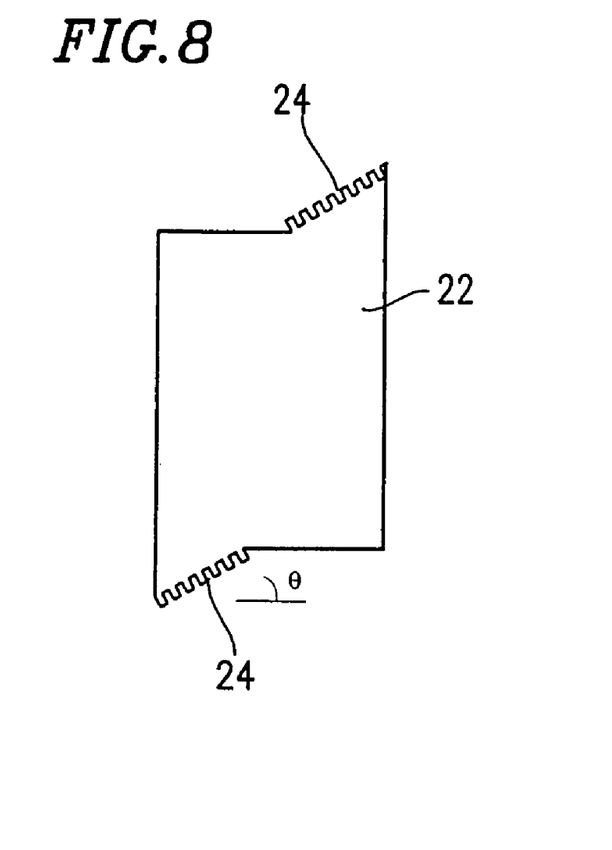
FIG. 8 is a plan view showing another auxiliary mask formed on the photomask of embodiment 2.

FIG. 8 is a plan view showing another example of the auxiliary mask 22 formed on the photomask 20.

The auxiliary mask 22 of FIG. 8 basically has the shape of a rectangle which has a pair of shorter sides parallel to the center lines between the adjoining rows of electrode pattern segments 21. Each of the shorter sides has a "peninsular" portion jutting above or below the shorter side. One of the peninsular portions is adjacent to an electrode pattern segment 21, whereas the other peninsular portion is not adjacent to the electrode pattern segment 21 as shown in FIG. 8. The peninsular portions have measurement patterns 24 inclined at θ° with respect to the center lines between the adjoining rows of electrode pattern segments 21. Even with the auxiliary mask 22 partially having such measurement patterns 24, an alignment deviation can be measured.

According to the present invention, a pattern (marker) for improving alignment accuracy is formed on a photomask, whereas in a conventional technique (Japanese Laid-Open Publication No. 6-275485), a marker for alignment is formed on a wafer (substrate) in a process for forming a channel pattern on the substrate for the purpose of improving the photomask alignment accuracy after a crystal growth process.

According to another conventional technique (Japanese Laid-Open Publication No. 10-70064) where laser light is used as alignment light, for the purpose of suppressing unnecessary interference of the laser light, a multi-mode laser is used as alignment light, or a high-speed switching circuit is additionally provided, whereby alignment accuracy is improved. However, according to the present invention, alignment accuracy is increased by improving a photomask pattern. The present invention does not improve alignment laser light for increasing the alignment accuracy.

According to still another conventional technique (Japanese Laid-Open Publication No. 2002-164610), the amount of deposition on an end surface of a laser element is adjusted by tilting a substrate with respect to a deposition flux, whereby controllability of the reflectance of the end face of the laser element is improved. However, the present invention relates to an electrode photomask alignment process, but does not relate to a process for coating the end face of the laser element.

As described above, a photomask of the present invention is used in a process of producing a semiconductor laser element which has window regions at its opposite end faces and an electrode on an upper surface thereof between the window regions. The photomask includes an electrode pattern region for forming an electrode pattern at a predetermined position over a laser substrate which includes a plurality of element regions, which will be element bodies of the semiconductor laser element, in a matrix pattern and a striped window region pattern at a predetermined position with respect to the element regions. The photomask further includes an auxiliary mask adjacent to the electrode pattern region. The auxiliary mask is used for measuring the amount of alignment deviation of the electrode pattern with respect to the window region pattern formed on the laser substrate. With this auxiliary mask, the photomask can be placed at an appropriate position such that the electrode pattern is placed appropriately with respect to the window region pattern of the laser substrate. Thus, alignment accuracy for electrode portions of the semiconductor laser elements produced using this photomask can be improved. The width of the window regions of the semiconductor laser elements obtained by separating the laser substrate is equal among the semiconductor laser elements, and the performance reliability of such semiconductor laser elements are high.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser element produced by a method comprising the steps of:
   using a photomask;
      wherein the photomask includes:
         an electrode pattern region for forming electrode pattern segments; and an auxiliary mask formed adjacent to the electrode pattern region for measuring the amount of alignment deviation of the electrode pattern segments with respect to a window region pattern,
         the auxiliary pattern mask having a measurement pattern slanted with respect to a longitudinal center line between adjoining rows of electrode pattern segments of the electrode pattern region wherein the longitudinal centerline is perpendicular to the width direction of the electrode pattern region, the longitudinal center line extending in a direction along which a laser substrate is to be separated into the semiconductor laser elements after the electrode pattern segments are formed on the laser substrate,
         wherein the measurement pattern includes a plurality of protrusions at a predetermined interval, the protrusions functioning as a scale for counting the amount of alignment deviation of the electrode pattern segments, the measurement pattern is slanted at an inclination angle of about 10° to 20° with respect to the longitudinal center line between the adjoining rows of the electrode pattern segments of the electrode pattern region and the width of each protrusion of the measurement pattern and the interval of the protrusions of the measurement pattern are 2–4 µm;
         wherein the auxiliary mask has the shape of a right-angled triangle formed based on a side extending along the longitudinal center line between the adjoining rows of the electrode pattern segments of the electrode pattern region and another side which is perpendicular to the longitudinal center line; wherein the measurement pattern is formed in the hypotenuse of the right-angled triangle and the measurement pattern has a reference portion for measuring the amount of alignment deviation of the electrode pattern segments, the reference portion being placed on the longitudinal center line between adjoining rows of electrode pattern segments of the electrode pattern region at a central portion of the electrode pattern region with respect to its width direction;
   placing the photomask over a laser substrate which includes a plurality of element regions, which will be element bodies of the semiconductor laser element, in a matrix pattern and a plurality of window region pattern stripes corresponding to window regions of the element regions; and
   counting a number of protrusions which overlap the window region of the laser substrate and which are placed higher than a reference portion of the measurement pattern of the auxiliary mask and the number of protrusions which overlap the window region of the laser substrate and which are placed lower than the reference portion of the measurement pattern of the auxiliary mask, and adjusting the position of the photomask such that the number of the overlapping protrusions which are placed higher than the reference portion is equal to the number of the overlapping protrusions which are placed lower than the reference portion, whereby the photomask is placed at an appropriate position on the laser substrate;

wherein for the semiconductor laser element:
the thicknesses of the window regions are equal at end faces of the semiconductor laser element obtained after separation of the laser substrate, wherein an electrode portion is superposed on the semiconductor laser element to include covering an inner portion of the upper surfaces of the window regions without covering the entire upper surfaces of the window regions the end faces of the semiconductor laser element.

2. A semiconductor laser element produced by a method comprising the steps of:

using a photomask
wherein the photomask includes:
an electrode pattern region for forming electrode pattern segments and an auxiliary mask formed adjacent to the electrode pattern region for measuring the amount of alignment deviation of the electrode pattern segments with respect to a window region pattern;
wherein the auxiliary mask has a measurement pattern slanted with respect to a longitudinal center line of the window region pattern which is perpendicular to the width direction of the window region pattern, the longitudinal center line extending in a direction along which the laser substrate is to be separated into the semiconductor laser elements after the electrode pattern segments are formed on the laser substrate;
wherein the measurement pattern includes a plurality of protrusions at a predetermined interval, the protrusions functioning as a scale for counting the amount of alignment deviation of the electrode pattern segments; the measurement pattern is slanted at an inclination angle of about 10° to 20° with respect to the longitudinal center line of the window region pattern and the width of each protrusion of the measurement pattern and the interval of the protrusions of the measurement pattern are 2–4 µm,
wherein the auxiliary mask has the shape of a right-angled triangle formed based on a side extending along the longitudinal center line of the window region pattern and another side which is perpendicular to the longitudinal center line; wherein the measurement pattern is formed in the hypotenuse of the right-angled triangle, and the measurement pattern has a reference portion for measuring the amount of alignment deviation of the electrode pattern segments, the reference portion being placed on the longitudinal center line of the window region pattern with respect to its width direction;

placing the photomask over a laser substrate which includes a plurality of element regions, which will be element bodies of the semiconductor laser element, in a matrix pattern and a plurality of window region pattern stripes corresponding to window regions of the element regions; and counting the number of protrusions which overlap the window region of the laser substrate and which are placed higher than the reference portion of the measurement pattern of the auxiliary mask and the number of protrusions which overlap the window region of the laser substrate and which are placed lower than the reference portion of the measurement pattern of the auxiliary mask, and adjusting the position of the photomask such that the number of the overlapping protrusions which are placed higher than the reference portion is equal to the number of the overlapping protrusions which are placed lower than the reference portion, whereby the photomask is placed at an appropriate position on the laser substrate;

wherein for the semiconductor laser element:
the thicknesses of the window regions are equal at end faces of the semiconductor laser element obtained after separation of the laser substrate, wherein an electrode portion is superposed on the semiconductor laser element to include covering an inner portion of the upper surfaces of the window regions without covering the entire upper surfaces of the window regions at the end faces of the semiconductor laser element.

* * * * *